United States Patent [19]

Van Den Berg

[11] Patent Number: 5,668,473
[45] Date of Patent: Sep. 16, 1997

[54] MAGNETORESISTIVE SENSOR INCLUDING SHORTENED MEASURING LAYERS

[75] Inventor: Hugo Van Den Berg, Herzogenaurach, Germany

[73] Assignee: Siemens, Aktiengesellschaft, Munich, Germany

[21] Appl. No.: 481,438

[22] PCT Filed: Dec. 16, 1993

[86] PCT No.: PCT/DE93/01205

§ 371 Date: Jun. 19, 1995

§ 102(e) Date: Jun. 19, 1995

[87] PCT Pub. No.: WO94/15224

PCT Pub. Date: Jul. 7, 1994

[30] Foreign Application Priority Data

Dec. 21, 1992 [DE] Germany ............... 42 43 357.6

[51] Int. Cl.[6] ............... G01R 33/06; G01R 33/09
[52] U.S. Cl. ............... 324/252; 338/32 R
[58] Field of Search ............... 324/252, 207.21; 338/32 R; 360/113

[56] References Cited

U.S. PATENT DOCUMENTS

| | | | |
|---|---|---|---|
| 4,097,802 | 6/1978 | Mahopac | 324/252 |
| 4,949,039 | 8/1990 | Grunberg | 324/252 |
| 5,206,590 | 4/1993 | Dieny et al. | 324/252 |
| 5,287,238 | 2/1994 | Baumgart et al. | 324/252 X |
| 5,436,778 | 7/1995 | Lin et al. | 360/113 |
| 5,528,440 | 6/1996 | Fontana et al. | 324/252 X |
| 5,532,892 | 7/1996 | Nix et al. | 360/113 |
| 5,573,809 | 11/1996 | Nix et al. | 427/123 |

FOREIGN PATENT DOCUMENTS

| | | |
|---|---|---|
| 0 216 062 | 4/1987 | European Pat. Off. . |
| 0 346 817 | 12/1989 | European Pat. Off. . |
| 0 432 890 | 6/1991 | European Pat. Off. . |
| 0 498 668 | 8/1992 | European Pat. Off. . |
| 26 20 657 | 2/1977 | Germany . |

OTHER PUBLICATIONS

Physical Review B, Condensed Matter, vol. 44, No. 10, 1 Sept. 1991, New York, US, pp. 5358–5361, V.S. Speriosu et al.: *Nonoscillatory Magnetoresistance in Co/Cu/Co Layered Structures with Oscillatory Coupling.*

Physical Review Letters, vol. 61, no. 21, 21 Nov. 1988, pp. 2472–2475, M.N. Baibich et al.: *Giant Magnetoresistance of (001) Fe/(001) Cr Magnetic Superlattices.*

Physical Review Letters, vol. 63, No. 6, 7 Aug. 1989,. pp. 664–667, R. E. Camley et al.: *Theory of Giant Magnetoresistance Effects in magnetic Layered Structures with Antiferromagnetic Coupling.*

Journal of Applied Physics, vol. 70, No. 10, 15 Nov. 1991, pp. 5864–5866, P. Lubitz et al.: *The Magnetoresistance of Uncoupled Fe-Cu-Co Sandwiches.*

Physical Review B, vol. 46, No. 1, 1 Jul. 1992, pp. 548–551; S.F. Lee et al.: *Field-Dependent Interface Resistance of Ag/Co Multilayers.*

(List continued on next page.)

Primary Examiner—Gerard R. Strecker
Attorney, Agent, or Firm—Kenyon & Kenyon

[57] ABSTRACT

A magnetoresistive sensor may include a layer system having at least one measuring layer exhibiting a magnetization in the plane of the layer. The magnetization depends inversely in at least one direction of an applied magnetic field. The layer system also includes at least one bias layer having a fixed magnetization in the plane of the layer. The at least one measuring layer and the at least one bias layer are exchange-decoupled from one another by an interlayer. In order to achieve magnetostatic decoupling of the measuring layer and the bias layer, the measuring layer is shorter than the bias layer at least in a direction parallel to the fixed magnetization. The ground state magnetization of the measuring layer and the magnetization of the bias layer are preferably at least approximately orthogonal to each other. In this manner, a magnetoresistive sensor is obtained which has a linear characteristic and maximum sensitivity.

18 Claims, 3 Drawing Sheets

OTHER PUBLICATIONS

*J. Appl. Phys.,* vol. 67, No. 9, 1 May 1990, pp. 5680–5682; C. Dupas et al.: *Very Large Magnetoresistance Effects Induced by Antiparallel Magnetization in two Ultrathin Cobalt Films.*

Journal of Magnetism and Magnetic Materials, vol. 94, 1991, L1–L5, Elsevier Science Publishers B.V., North Holland, D.H. Mosca et al.: *Oscillatory Interlayer Coupling and Giant Magnetoresistance in Co/Cu Multilayers.*

Journal of Magnetism and Magnetic Materials, vol. 93, 1991, pp. 101–104, Elsevier Science Publishers B.V., North Holland, B. Dieny et al.: *Spin–Valve Effect in Soft Ferromagnetic Sandwiches.*

IBM Technical Disclosure Bulletin, vol. 25 No 2, Jul. 1982, IBM Corp 1982, Mr Element Position Detector, Sharma et al.

MAGNETORESISTIVE SENSOR INCLUDING SHORTENED MEASURING LAYERS

BACKGROUND OF THE INVENTION

The present invention relates to a magnetoresistive sensor. More particularly, the present invention relates to a magnetoresistive sensor including a layer system having a measuring layer, a bias layer, and an interlayer, and including measuring contacts on the layer system.

In ferromagnetic transition metals such as nickel (Ni), iron (Fe) or cobalt (Co), and in alloys containing these metals, the electrical resistance depends on the magnitude and direction of a magnetic field permeating the material. This effect is referred to as anisotropic magnetoresistance (AMR) or anisotropic magnetoresistive effect. This is physically based on the different scattering cross sections of electrons having different spins which correspondingly are referred to as majority electrons and minority electrons of the D band. A thin layer made of such a magnetoresistive material having a magnetization in the plane of the layer is generally used for magnetoresistive sensors. The change in resistance as the magnetization rotates with respect to the direction of the current may amount to several percent of the normal isotropic resistance.

Multilayer systems are known which comprise a plurality of ferromagnetic layers which are arranged in a stack and are separated from one another by metallic interlayers, and whose magnetizations in each case coincide with the plane of the layer. The respective layer thicknesses in this arrangement are chosen to be considerably smaller than the mean free path of the conduction electrons. In such layer systems there then arises, in the individual layers, in addition to the anisotropic magnetoresistive effect, the so-called giant magnetoresistive effect or giant magnetoresistance (Giant MR), which is due to the differential scattering of majority and minority conduction electrons in the bulk of the layers, especially in alloys, and at the interfaces between the ferromagnetic layers and the interlayers. This Giant MR is an isotropic effect and may be considerably larger than the anisotropic MR, with values of up to 70% of the normal isotropic resistance.

Two basic types of such Giant-MR multilayer systems are known. In the first type, the ferromagnetic layers are antiferromagnetically coupled to one another via the interlayers, so that those magnetizations of two adjacent ferromagnetic layers, which coincide with the planes of the layers, align themselves antiparallel with respect to one another in the absence of an external magnetic field. An example of this type of Giant-MR multilayer systems are iron-chromium superlattices (Fe—Cr superlattices) having ferromagnetic layers consisting of Fe and antiferromagnetic interlayers consisting of Cr. An external magnetic field causes the magnetizations of adjacent ferromagnetic layers to rotate against the antiferromagnetic coupling forces and to align themselves in parallel. This reorientation of the magnetizations by the magnetic field results in a steady decrease of the Giant MR, which decrease is a measure for the magnitude of the magnetic field. Once a saturation field strength $H_S$ is reached, no further change in the Giant MR takes place, because all magnetizations are then aligned in parallel with respect to one another. The Giant MR in this situation depends solely on the magnitude of the field strength ("Physical Review Letters", Vol. 61, No. 21, Nov. 21st 1988, pages 2472–2475).

This type of Giant-MR multilayer system comprising antiferromagnetically coupled ferromagnetic layers has also been the subject of theoretical calculations which show that the current coefficients and the transmission coefficients for spin-up electrons scattered at the interfaces and similar spin-down electrons depend on the angle between the magnetizations in adjacent ferromagnetic layers. According to these calculations, the Giant MR increases steadily as the angle between the two magnetizations increases from 0° to 180°, and is greatest at an angle of 180° ("Physical Review Letters", Vol. 63, No. 6, August 1989, pages 664–667).

In the second type of Giant-MR multilayer systems, ferromagnetic layers whose magnetizations in the planes of the layers are, on average, parallel to one another, are separated from one another by diamagnetic or paramagnetic interlayers consisting of metal. The thickness of the interlayers is chosen to be sufficiently large for the magnetic exchange coupling between the magnetizations of the ferromagnetic layers to be as small as possible. In each case, adjacent ferromagnetic layers have different coercive field strengths. As a result, the mean values, which are initially parallel in saturation, of the magnetizations $M_1$ and $M_2$ of magnetically softer measuring layers and adjacent, magnetically harder bias layers are rotated differentially by a magnetic field H, and an angle Phi between the mean values of the magnetizations $M_1$ and $M_2$ is established which depends on the magnetic field H. The dependence of the individual magnetizations $M_1$ and $M_2$ on the magnetic field H in the process results from the corresponding hysteresis curves of the magnetically softer and the magnetically harder material. Between the coercive field strengths $H_{c1}$ of the magnetically softer and $H_{c2}$ of the magnetically harder layers, and between $-H_{c2}$ and $-H_{c1}$ there is in each case a region in which the magnetization Mm is already saturated and the magnetization $M_2$ still has its value corresponding to saturation and is aligned antiparallel to the magnetization $M_1$, i.e., Phi=180° In this region the MR signal is at a maximum and constant. Different coercive field strengths $|H_{c1}| \leq |H_{c2}|$ can be set by selecting different materials or by different fabrication processes or the selection of different thicknesses of the same material. Known layer structures comprising different materials are, for example, NiFe—Cu—Co layer structures and Fe—Cu—Co structures. A known layer system based on different fabrication or different thicknesses is a Co—Au—Co system ("Journal of Applied Physics", Vol. 70, No. 10, Nov. 15, 1991, pages 5864–5866). The MR signal of these known layer systems then, however, depends on its previous history, i.e., along which path and between which values for the magnetic field and in which direction the hysteresis curves are traversed. On the basis of such a layer system it is therefore not possible to implement an MR sensor having an unambiguous, reversible characteristic curve. Moreover, in these known layer systems part of the magnetic flux of the harder bias layers forms a circuit above the softer measuring layers. This magnetic interference field reduces the measuring sensitivity of the sensor and results in an undesirable shift of the sensor characteristic curve.

European Patent Document No. EP-A-0 346 817 discloses a magnetoresistive sensor including a layer system comprising a ferromagnetic measuring layer and a ferromagnetic bias layer which, by a non-magnetic interlayer, are exchange-decoupled from one another. The magnetoresistive sensor also includes measuring contacts at the layer system for applying an electric current and taking off a measured voltage which is a measure for an applied magnetic field. In a first embodiment of this known magnetoresistive sensor the measuring layer has a smaller coercive field strength than the bias layer. In a second embodiment, in contrast, an antiferromagnetic layer lies against the bias layer. The measuring layer therefore has, in the plane of the layer, a rotatable magnetization which, within the measuring range of the magnetic field, depends inversely on the magnetic field, whereas the bias layer in its plane has a magnetization which is constant in the measuring range.

SUMMARY OF THE INVENTION

The present invention relates to a magnetoresistive sensor which includes a layer system comprising at least one measuring layer and at least one bias layer exchange-decoupled from the measuring layer by an interlayer. The magnetoresistive sensor has an unambiguous characteristic curve and with which any interference fields of the bias layer are largely suppressed in the measuring layer. In addition, a magneto-resistive sensor having an at least essentially linear characteristic curve is to be specified.

According to an embodiment of the present invention, the magnetoresistive sensor includes a layer system and measuring contacts on the layer system. The layer system includes at least one measuring layer, at least one bias layer, and an interlayer which magnetically exchange-decouples the bias layer from the measuring layer. The at least one measuring layer has a plane in which a magnetization, at least in one direction, depends inversely on an applied magnetic field. If the applied magnetic field is absent, the magnetization corresponds to a predefined ground state magnetization. The bias layer is located on at least one side of the at least one measuring layer and has a magnetization in the plane thereof which is at least approximately constant in a measuring range of the applied magnetic field. The measuring contacts detect a resistance signal which is a measure for the applied magnetic field. The layer system is provided, at least in a direction running parallel to the magnetization of the bias layer, with boundary zones not having a measuring layer.

The magnetization $\overline{M}_M$ of the measuring layer depends, at least in one direction, reversibly (i.e., inversely), and therefore unambiguously, on the magnetic field to be measured. In the ground state (i.e., if no magnetic field is applied), the magnetization $\overline{M}_M$ is established as a predefined ground state magnetization. The bias layer is provided with a magnetization $\overline{M}_B$ which is at least approximately constant in the measuring range. As a result, a resistance signal is obtained which depends unambiguously on the magnetic field.

In the most adverse case, the stray field of the bias layer may result in the ground state magnetization $\overline{M}_{MO}$ in the measuring layer being aligned antiparallel to the magnetization $\overline{M}_B$ in the bias layer even if no magnetic field is applied. In order to prevent part of the magnetic flux of the bias layer, especially at a large magnetization $\overline{M}_B$, from forming a circuit above the measuring layer, the measuring layer is shorter at its boundary, in at least one direction parallel to the magnetization $\overline{M}_B$ of the bias layer, than the bias layer, so that the bias layer in said direction projects beyond the measuring layer on both sides.

In an advantageous embodiment of the present invention, the measuring layer is shorter over its entire boundary zone than the bias layer.

Preferably, the transitions between the border regions without a measuring layer and a central measuring zone having a measuring layer are designed to be fluid in character. For example, the thickness of the measuring layer in these transition zones may increase continuously toward the center.

At least two measuring contacts are provided for measuring the resistance of the layer system. These measuring contacts may be arranged at a distance from one another, preferably of the uppermost layer, so that the test current on average flows parallel to the planes of the layers (cip= current-in-planes). In another embodiment, the measuring contacts are arranged on the uppermost and the lowermost layer, so that the test current flows perpendicular to the planes of the layers (cpp=current-perpendicular-to-planes). A layer system having cpp measuring contacts arranged in such a manner is disclosed, for example, in "Physical Review B", Vol. 46, No. 1 (1992), pages 548–551.

In an advantageous embodiment of the present invention, the measuring layer is provided with a magnetic preferred axis $A_M$. Alternatively, the measuring layer may also be selected from a superparamagnetic material. In that case its magnetization $\overline{M}_M$ in all directions depends inversely on the magnetic field.

If no magnetic field is applied, a ground state magnetization $\overline{M}_{MO}$ of the measuring layer is established. This ground state magnetization $\overline{M}_{MO}$ of the measuring layer then, in one embodiment, is aligned parallel to the magnetization $\overline{M}_B$ of the bias layer. To this end, the measuring layer is magnetized in line with a preferred axis aligned parallel with the magnetization $\overline{M}_B$.

In a particularly advantageous embodiment of the present invention, the ground state magnetization $\overline{M}_{MO}$ of the measuring layer and the fixed magnetization $\overline{M}_B$ of the bias layer are aligned at least approximately perpendicular to each other. As a result, the working point of the sensor, if no magnetic field is present (i.e., H=0), is set in a range in which the characteristic curve is at least approximately linear and has a maximum ascent.

In order to align the magnetizations $\overline{M}_{MO}$ and $\overline{M}_B$ at least approximately perpendicular to one another, the measuring layer is preferably provided with a magnetic preferred axis $A_M$ which is aligned at least approximately perpendicular to the fixed magnetization $\overline{M}_B$ of the bias layer, and is magnetized along this preferred axis $A_M$.

In another embodiment of the present invention, use is made of the so-called 90° coupling. The thickness of the interlayer is set to a value at which the magnetic exchange coupling between the measuring layer and the bias layer changes in sign (i.e., switches over from a ferromagnetic coupling to an antiferromagnetic coupling or vice versa). Due to the random fluctuations of the thickness, the ground state magnetization $\overline{M}_{MO}$ of the measuring layer is, on average, established automatically at an angle of 90° with respect to the magnetization $M_B$ of the bias layer.

In the case of various materials and various geometries of the layers, it may be necessary, in order to compensate for the arising demagnetizing fields, for the angle between $\overline{M}_{MO}$ and $\overline{M}_B$ to be set to a value slightly differing from 90° in order to achieve a working point which is optimal for linearity and sensitivity of the sensor.

Major deviations from the at least approximately perpendicular alignment of the magnetizations $\overline{M}_{MO}$ and $\overline{M}_B$ with respect to one another impair the sensitivity and linearity of the sensor.

A possible cause for such troublesome deviations of the angle between the two magnetizations $\overline{M}_{MO}$ and $\overline{M}_B$ may reside in a small residual magnetic flux of the bias layer still forming a circuit above the measuring layer. In a further embodiment of the present invention, the magnitude of the magnetization $|\overline{M}_B|$ of the bias layer is therefore chosen to be smaller than that of the ground state magnetization $|\overline{M}_{MO}|$ of the measuring layer.

Deviations from the predefined alignments for the magnetizations $\overline{M}_{MO}$ and $\overline{M}_B$ are also possible as a result of demagnetizing fields, particularly in the boundary zones of the layers and in particular in the bias layer. Therefore, in a preferred embodiment of the present invention, the measuring contacts for measuring the resistance may be moved into an inner measuring zone of the layer system, in order to prevent the effect of these boundary zones on the test signal.

In a further particularly advantageous embodiment of the present invention, the layers are of elongated design, their longitudinal direction running perpendicular to the ground state magnetization $\overline{M}_{MO}$ of the measuring layer. As a result, the orientation of the magnetization $\overline{M}_B$ is particularly stable. At the same time, a high sensitivity of the sensor is achieved and the shift of its characteristic curve is reduced, because the demagnetizing fields generated by the measuring layer and the bias layer are greatly attenuated and their effect counteracting the magnetic field to be measured is reduced.

For the purpose of deflecting the magnetic flux of the measuring layer it is possible, in a further embodiment of the present invention, to replace at least one measuring layer by two measuring layers whose magnetizations are aligned antiparallel with respect to one another and which are separated by an interlayer. Preferably, both magnetizations are inclined at about the same angle in such a way with respect to the direction of the normal of the magnetization $\overline{M}_B$ of the bias layer that they enclose an angle of less than 180° This additionally reduces the formation of domains in the measuring layers.

The embodiments of layer subsystems described hitherto can be combined with one another and be arranged in a stack comprising a multiplicity of such subsystems. The alignments of the magnetizations $\overline{M}_B$ of the bias layers are identical in all embodiments. The ground state magnetizations $\overline{M}_{MO}$ of the measuring layers are either collinear or aligned perpendicular to the magnetizations $\overline{M}_B$ of the bias layers. The subsystems are in each case separated from one another by a further interlayer.

BRIEF DESCRIPTION OF THE DRAWINGS

A more detailed explanation of embodiments of the present invention is set forth in the following description, in conjunction with the attached drawings.

DETAILED DESCRIPTION

Figure 1:
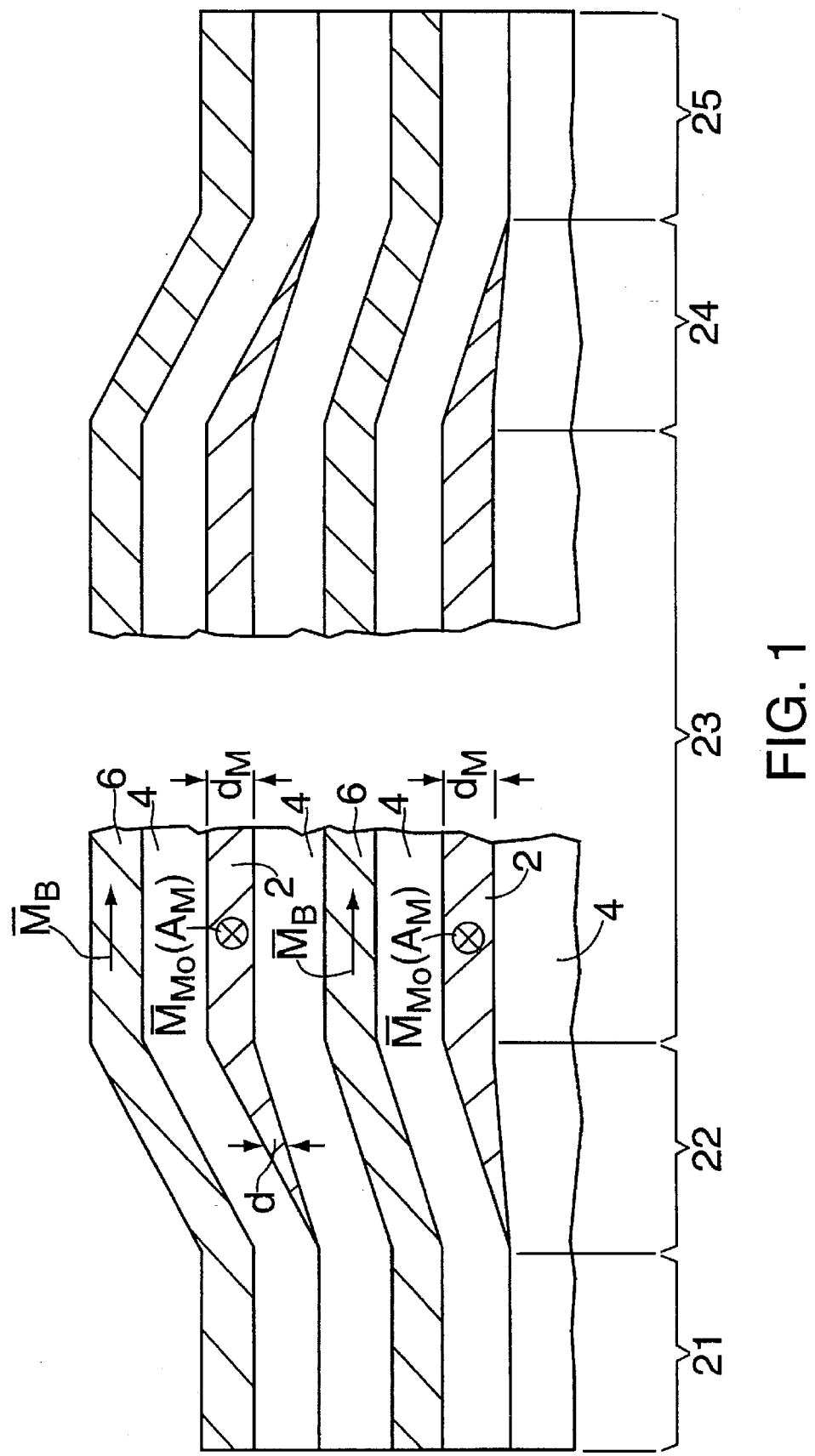
FIG. 1 and FIG. 2 each schematically depict an embodiment of the present invention in a cross-sectional view in which a magnetoresistive sensor has boundary zones without a measuring layer.

FIG. 1 illustrates a magnetoresistive sensor according to an embodiment of the present invention including a plurality of magnetic measuring layers 2 and a plurality of magnetic bias layers 6. Only two of the magnetic measuring layers 2 and two of the magnetic bias layers 6 are illustrated in FIG. 1. Non-magnetic interlayers 4 are arranged in each case between a measuring layer 2 and a bias layer 6. All layers consist of an electrically conductive material, and their thicknesses are considerably smaller than the mean free path of the conducting electrons. The measuring layers 2 have ground state magnetizations $\overline{M}_{MO}$ along preferred axes, which are indicated by $A_M$ and run in the planes of the layers of the measuring layers 2, the magnetizations being parallel with respect to one another and preferably of equal magnitude. The bias layers 6 are provided with fixed magnetizations $\overline{M}_B$ in the planes of their layers, which are aligned at least approximately perpendicular to the preferred axes $A_M$ of the measuring layer 2, the magnetizations being parallel with respect to one another and preferably of equal magnitude and are shown in the plane of projection. The magnetizations $\overline{M}_B$ may, however, alternately have the opposite direction. Due to the at least approximately orthogonal alignment of the preferred axes $A_M$ and thus of the ground state magnetizations $\overline{M}_{MO}$ relative to the magnetizations $\overline{M}_B$, the working point of the sensor in this preferred embodiment is located in an at least approximately linear region of the characteristic curve which at the same time has the greatest ascent. For the purpose of compensating for demagnetizing fields, the angle between the magnetizations $\overline{M}_{MO}$ and $\overline{M}_B$ may deviate slightly from 90°.

If a magnetic field $\overline{H}$, not shown in FIG. 1, is applied in the plane of the layer, the magnetizations $\overline{M}_M$ in the measuring layers 2 change from the ground state magnetizations $\overline{M}_{MO}$, and the magnetizations $\overline{M}_B$ of the bias layers 6 remain essentially unchanged. A component $\overline{H}_v$ of the magnetic field perpendicular to the preferred axes $A_M$ of the measuring layers 2 rotates the magnetizations $\overline{M}_M$ of the measuring layers 2 in the direction toward the magnetizations $\overline{M}_B$ or — $\overline{M}_B$, in accordance with the field direction $\overline{H}$. At saturation, the magnetizations $\overline{M}_M$ and $\overline{M}_B$ are then aligned parallel or antiparallel to one another. This rotation process generates a Giant Magnetoresistive signal as a function of the angle of rotation. A component $\overline{H}_p$ of the magnetic field $\overline{H}$ parallel to the preferred axes $A_M$, in contrast, causes a domain wall shift and thus merely a change in direction of the magnetizations $\overline{M}_M$ at the domain walls. This does not cause a magnetoresistive signal to be generated. In the case of a magnetic field perpendicular to the plane of the layer, given the high demagnetizing fields in the measuring layers 2, likewise virtually no rotation processes take place and consequently no magnetoresistive signal is measured. The magnetoresistive sensor is therefore essentially sensitive only to that component $\overline{H}_v$ of the magnetic field $\overline{H}$, which is aligned orthogonally to the preferred axes $A_M$ in this embodiment or generally to the ground state magnetizations $\overline{M}_{MO}$ of the measuring layers 2.

The magnetizations $\overline{M}_B$ of the bias layers 6 are to remain constant in the measuring zone of the applied field H and, in particular, are not to rotate in the plane of the layer. To this end, in one embodiment of the present invention, the bias layers may each be impressed with a magnetic, uniaxial anisotropy, especially a crystal anisotropy, a field-induced anisotropy or a voltage-induced anisotropy.

The bias layers are then magnetized along their anisotropy axes.

Preferably, a plurality of layer subsystems comprising a measuring layer, an interlayer and a bias layer are provided, which are separated in each case by an interlayer and are arranged in a periodic stack. The number of these layer subsystems is generally chosen to be between 1 and 100.

For the purpose of measuring the resistance, two measuring contacts are disposed, preferably on the uppermost layer of the layer system, at a distance from each other which is preferably considerably greater than the thickness of the layer system (cip). In another embodiment, the measuring contacts are disposed on the upper side and the underside of the layer system (cpp). Their distance then corresponds to the thickness of the layer system. Typical thicknesses of the layer system overall are between 3 nm and 400 nm, and typical distances of the measuring contacts are in the range from 3 nm to 1 mm. An electrical current of conduction electrons (not shown in FIG. 1) is formed in the entire layer system between the two measuring contacts.

To achieve the objective of magnetostatic decoupling from the bias layers 6, the measuring layers 2 are shorter at their boundaries, in the direction of the magnetizations $\overline{M}_B$ Of the bias layers 6, than the bias layers. The layer system is therefore provided with two boundary zones 21 and 25 in which no measuring layer 2 is present, and for a central measuring zone 23 having measuring layers 2. This shortening of the measuring layers 2 is effected at least in the direction parallel to the magnetization $\overline{M}_B$ of the bias layer 6 and preferably in all directions, so that the bias layers 6 project all around beyond the measuring layers. The interlayers 4 are preferably as long as the bias layers 6.

Between the boundary zones 21 and 25 and the measuring zone 23 in this embodiment a transition zone 22 and 24, respectively, is provided in each case, in which the thickness of the measuring layers 2 increases continuously inwards from the outside. The bias layers 6 and the interlayers 4 have at least approximately the same thickness in the transition zones 22 and 24 as in the boundary zones 21 and 25 and in the measuring zone 23. The thicknesses d of the measuring layers 2 increase linearly in the transition zones 22 and 24 under a specific flare angle from d=0 in the boundary zones 21 and 25 up to a constant value $d=d_M$ in the measuring zone 23.

Figure 2:
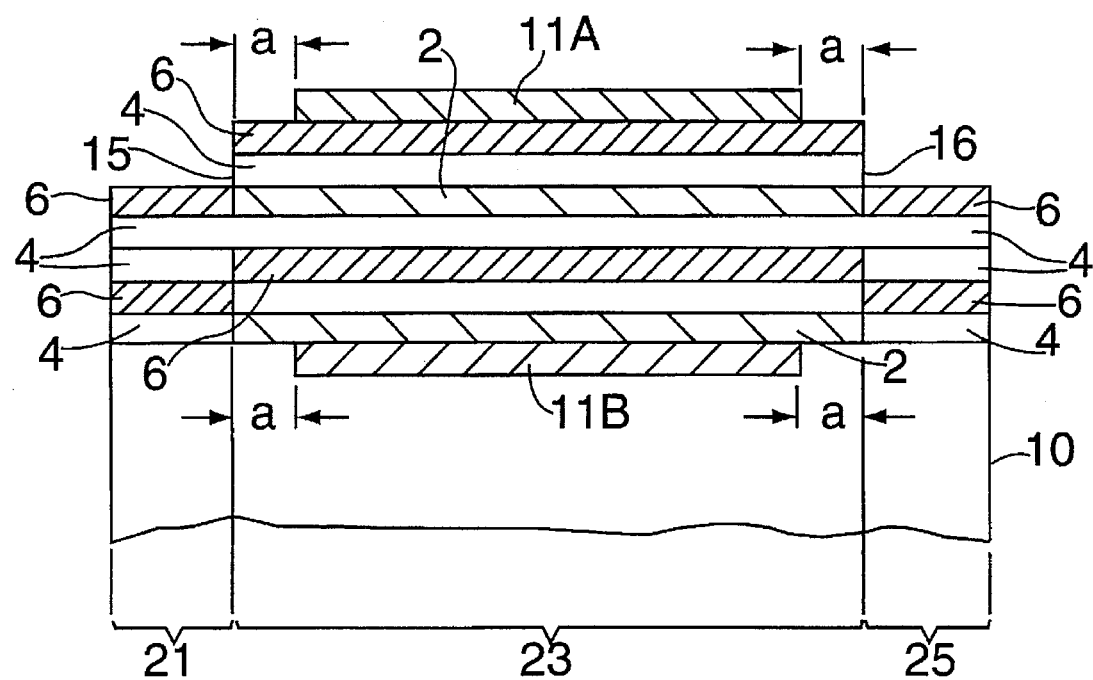

In a simple embodiment of the present invention according to FIG. 2, instead of transition zones between the boundary zones 21 and 25 and the measuring zone 23 a step is provided in each case whose height corresponds to the total thickness of the measuring layers 2 absent in the boundary zones 21 and 25. The layer structure in the boundary zones 21 and 25 in this arrangement preferably results from the measuring layers 2 being omitted and can be achieved by a suitable lithographic process. The layer system is arranged on a substrate 10. Such a substrate 10 is preferably also provided in all other embodiments. Two measuring contacts 11A and 11B are provided on the uppermost and the lowermost layer respectively in a cpp arrangement. The current then flows between the two measuring contacts 11A and 11B, on average perpendicular to the layer planes. The measuring contacts 11A and 11B are each situated at a preferably identical distance a from the ends 15 and 16 of the measuring zone 23, in order to circumvent troublesome edge effects on the measured signal which are due to demagnetizing fields at said ends 15 and 16.

Figure 3:
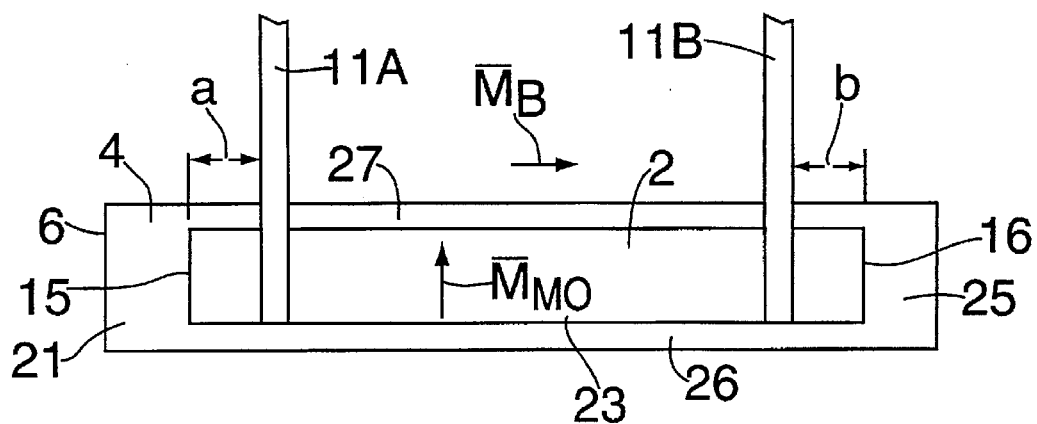
FIG. 3 schematically depicts an embodiment of the present invention having measuring contacts moved inwards in a plan view.

In a preferred embodiment of the present invention shown in a plan view in FIG. 3, the layers are constructed as rectangular strips whose longitudinal direction runs perpendicular to the ground state magnetization $M_{MO}$ of the measuring layer 2. As a result of this measure, the demagnetizing fields directed counter to the measuring field are distinctly attenuated and the sensitivity of the sensor is thus increased and any shift of the measuring characteristic curve is avoided. Now the measuring layer 2 is shorter than the bias layer 6 not only in the direction of the magnetization $M_B$ but also in the direction perpendicular to $\overline{M}_B$ on both sides. The measuring zone 23 of the layer system comprising measuring layer 2 therefore has the shape, in the projection shown perpendicular with respect to the layer planes, of a rectangle which is situated entirely within the rectangle formed by the entire layer system without the measuring layer, i.e., the measuring zone 23 and the boundary zones 21, 25, 26 and 27. For the purpose of measuring the resistance, measuring contacts 11A and 11b are provided in a cip arrangement. In order to avoid interference effects due to demagnetizing fields at the ends 15 and 16 of the measuring zone 23, the measuring contacts 11A and 11B are preferably arranged so as to be offset inwards into the measuring zone 23 in the longitudinal direction by a distance of a and b, respectively. The two distances a and b are preferably of equal size. The measuring contacts 11A and 11B are preferably positioned on the measuring layer 2, but may alternatively be appropriately positioned on a bias layer 6 or an interlayer 4.

Figure 4:
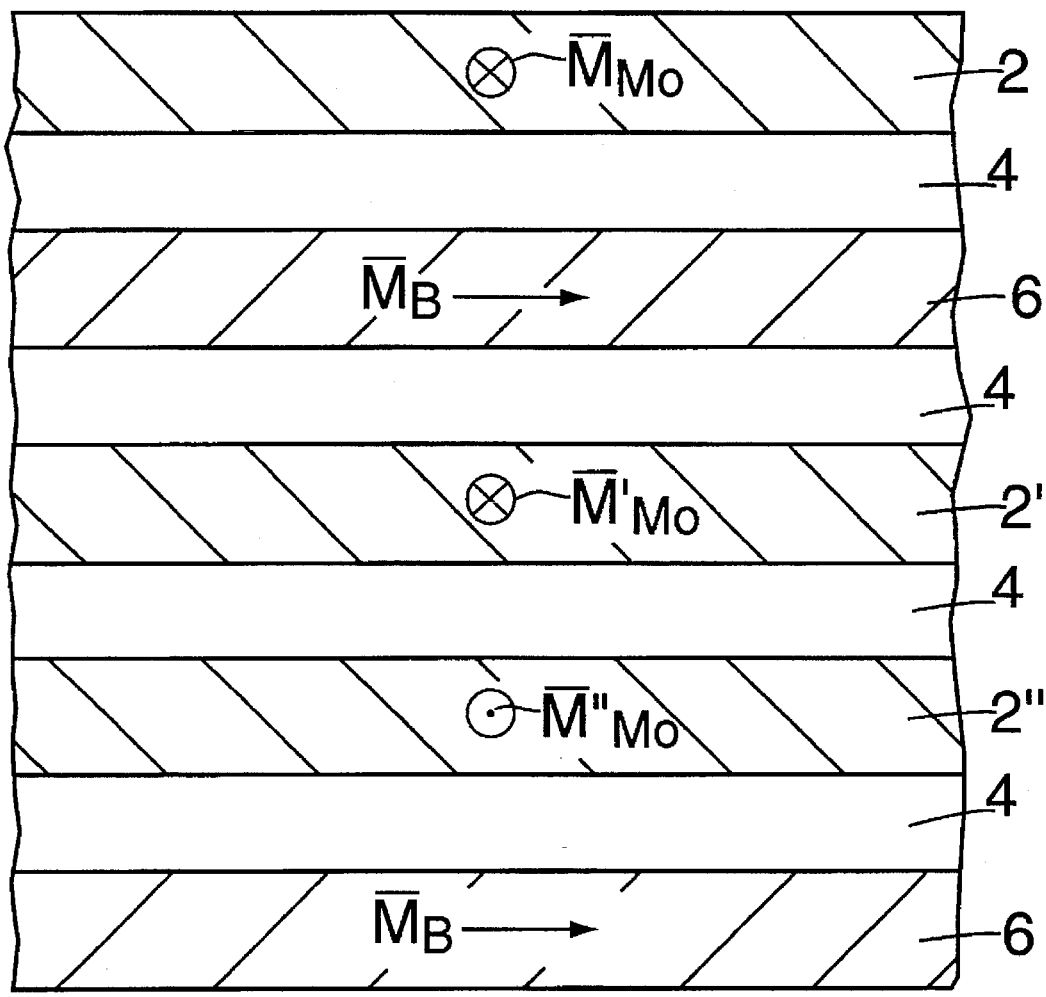
FIG. 4 schematically depicts an embodiment of the present invention having two adjacent measuring layers in a cross-sectional view.

FIG. 4 illustrates a particular embodiment of the measuring zone 23 of the magnetoresistive sensor according to the present invention in which at least one measuring layer 2 has been replaced by two measuring layers 2' and 2". The ground state magnetizations $\overline{M}_{MO'}$ and $\overline{M}_{MO''}$ of these two measuring layers 2' and 2", respectively, are now aligned antiparallel with respect to one another, preferably by impressing appropriate preferred axes, and are preferably of equal magnitude, (i.e., $\overline{M}_{MO'}=-\overline{M}_{MO''}$). Subsequently, the magnetic flux of the measuring layers 2' and 2" remains essentially confined to the measuring layers 2' and 2" and does not encroach on the adjacent bias layers 6. The bias layers 6 are in each case provided with equidirectional magnetizations $\overline{M}_B$ which are aligned at least approximately perpendicular to the ground state magnetizations $\overline{M}_{MO'}$ and $\overline{M}_{MO''}$ of the measuring layers 2' and 2", respectively.

Because of fluctuations in the directions of the preferred axes and a non-unambiguous sense of rotation resulting therefrom for the magnetizations $\overline{M}_{M'}$ and $\overline{M}_{M''}$ from the ground state magnetizations $\overline{M}_{MO'}$ and $\overline{M}_{MO''}$, respectively, domains are generally formed in the measuring layers 2' and 2" after saturation at smaller field values. In a particular embodiment of the present invention (not shown in the drawings) the ground state magnetizations $\overline{M}_{MO'}$ and $\overline{M}_{MO''}$ of the two measuring layers 2' and 2" respectively, are each set, to avoid this domain formation, at a small angle with respect to the direction of the normal to the magnetization $\overline{M}_B$ of the bias layers 6, in a different sense of rotation, so that between themselves they enclose an angle of slightly less than 180°. This can be achieved by impressing on the corresponding measuring layers 2' and 2" preferred axes which are suitably inclined with respect to one another. As a result, for each of the two magnetizations $\overline{M}_{M'}$ and $\overline{M}_{M''}$ an unambiguous sense of rotation is predefined from the saturation when a magnetic field $\overline{H}$ is applied.

The magnetic materials provided for the measuring layers may be, for example, Co, Fe, Ni, SmCo or TbFeCo, and for the bias layers $Ni_{80}Fe_{20}$ or $Ni_{66}CoFe$ can be used. The interlayers preferably comprise Cu, Au, Ag or Cr.

I claim:

1. A magnetoresistive sensor comprising:
   a) a layer system comprising:
      a1) at least one measuring layer which, in a plane of the at least one measuring layer, has a magnetization which at least in one direction depends inversely on an applied magnetic field and, if the applied magnetic field is absent, corresponds to a predefined ground state magnetization;
      a2) a bias layer located on at least one side of the measuring layer, the bias layer having a magnetization in the plane of the bias layer, which magnetization is at least approximately constant in a measuring range of the applied magnetic field;
      a3) an interlayer, wherein the bias layer is at least approximately magnetically exchange-decoupled from the measuring layer by the interlayer; and b) measuring contacts for connecting a measuring device to the layer system to detect a resistance signal which is a measure for the applied magnetic field;

wherein a length of the bias layer in a direction parallel to the magnetization of the bias layer is greater than a length of the measuring layer in the same direction, so that the layer system includes boundary zones which do not have a measuring layer.

2. The magnetoresistive sensor as claimed in claim 1, wherein a an area occupied by the measuring layer is is smaller than an area occupied by the bias layer.

3. The magnetoresistive sensor as claimed in claim 1, wherein a thickness of the measuring layer in transition zones between the boundary zones of the layer system without the measuring layer and an inner measuring zone with the measuring layer increases continuously.

4. The magnetoresistive sensor as claimed in claim 1, wherein the ground state magnetization of the measuring layer and the magnetization of the bias layer are aligned at least approximately perpendicular to each other.

5. The magnetoresistive sensor as claimed in claim 1, wherein the ground state magnetization of the measuring layer and the magnetization of the bias layer are aligned parallel to each other.

6. The magnetoresistive sensor as claimed in claim 1, wherein a magnitude of the magnetization of the bias layer is smaller than a magnitude of the ground state magnetization of the measuring layer.

7. The magnetoresistive sensor as claimed in claim 1, wherein the measuring layer and the bias layer are preferentially extended in a longitudinal direction perpendicular to the ground state magnetization of the measuring layer.

8. The magnetoresistive sensor as claimed in claim 1, wherein the measuring contacts are arranged so as to be at a distance from the boundary of the layer system.

9. The magnetoresistive sensor as claimed in claim 1, wherein the measuring contacts are arranged on an uppermost layer of the layer system.

10. The magnetoresistive sensor as claimed in claim 1, wherein the measuring contacts are arranged on a lowermost layer of the layer system.

11. The magnetoresistive sensor as claimed in claim 1, wherein the measuring contacts are arranged on an uppermost layer of the layer system and on a lowermost layer of the layer system.

12. The magnetoresistive sensor as claimed in claim 1, wherein at least one measuring layer of the at least one measuring layer includes two measuring layers which are magnetically exchange-decoupled by an interlayer.

13. The magnetoresistive sensor as claimed in claim 12, wherein ground state magnetizations of the two measuring layers are aligned at least approximately antiparallel with respect to one another if no magnetic field is applied.

14. The magnetoresistive sensor as claimed in claim 12, wherein ground state magnetizations of the two measuring layers are each inclined by at least approximately a same angle with respect to a direction normal to the magnetization of the bias layer, and between one another enclose an angle of less than 180° if no magnetic field is applied.

15. The magnetoresistive sensor as claimed in claim 1, wherein each measuring layer is magnetized in a direction of a preferred axis if no magnetic field is present.

16. The magnetoresistive sensor as claimed in claim 12, wherein each measuring layer is magnetized in a direction of a preferred axis if no magnetic field is present.

17. The magnetoresistive sensor as claimed in claim 1, wherein the bias layer is magnetized along a preferred axis.

18. The magnetoresistive sensor as claimed in claim 1, wherein a plurality of layer systems, which are each formed from a measuring layer, an interlayer and a bias layer, are arranged above one another in such a way that a periodic layer sequence results, and wherein the plurality of layer systems are separated from one another in each case by an interlayer.

* * * * *